(12) United States Patent
Jin (10) Patent No.: US 11,108,019 B2
(45) Date of Patent: Aug. 31, 2021

(54) OLED DISPLAY PANEL AND DISPLAY DEVICE HAVING A TRANSPARENT FILLING LAYER

(71) Applicant: Wuhan China Star Optoelectronics Semiconductor Display Technology Co., Ltd., Wuhan (CN)

(72) Inventor: Jiangjiang Jin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 32 days.

(21) Appl. No.: 16/631,176

(22) PCT Filed: Jul. 12, 2019

(86) PCT No.: PCT/CN2019/095761
§ 371 (c)(1),
(2) Date: Jan. 15, 2020

(87) PCT Pub. No.: WO2020/155570
PCT Pub. Date: Aug. 6, 2020

(65) Prior Publication Data
US 2021/0143364 A1    May 13, 2021

(30) Foreign Application Priority Data

Jan. 31, 2019   (CN) .......................... 201910097591.1

(51) Int. Cl.
*H01L 51/52* (2006.01)
*G02F 1/13* (2006.01)
*G02F 1/1339* (2006.01)

(52) U.S. Cl.
CPC ...... *H01L 51/5253* (2013.01); *H01L 51/5234* (2013.01); *G02F 1/13394* (2013.01)

(58) Field of Classification Search
CPC ............. H01L 51/5253; H01L 51/5234; G02F 1/13394
See application file for complete search history.

(56) References Cited

U.S. PATENT DOCUMENTS

| | | | | |
|---|---|---|---|---|
| 7,446,837 | B2* | 11/2008 | Nakano | G02F 1/133514 349/114 |
| 9,105,545 | B2* | 8/2015 | Nakata | H01L 27/14643 |
| 10,347,862 | B2* | 7/2019 | Sonoda | H01L 27/3244 |
| 10,672,841 | B2* | 6/2020 | Kim | G09G 3/3258 |

(Continued)

FOREIGN PATENT DOCUMENTS

| | | |
|---|---|---|
| CN | 106505086 | 3/2017 |
| CN | 107359185 | 11/2017 |
| CN | 109244039 | 1/2019 |

*Primary Examiner* — Ida M Soward (57) ABSTRACT

An organic light emitting diode (OLED) display panel includes a light transmitting area at least partially disposed in an electronic component setting area. A transparent filling layer, a built-in encapsulation layer, and a planarization layer are disposed in the light transmitting area. By providing the transparent filling layer in the light transmitting area to replace part of a film layer material, light transmittance is improved, and there is no technical problem that it is difficult to package. The built-in encapsulation layer reduces the speed at which water and oxygen penetrate the inside of a display panel through the transparent filling layer.

20 Claims, 9 Drawing Sheets

(56) References Cited

U.S. PATENT DOCUMENTS

2017/0070679 A1  3/2017  Chung et al.
2019/0157331 A1* 5/2019  Bando .................... H01L 27/30
2020/0328373 A1 10/2020 Huang et al.

* cited by examiner

OLED DISPLAY PANEL AND DISPLAY DEVICE HAVING A TRANSPARENT FILLING LAYER

RELATED APPLICATIONS

This application is a National Phase of PCT Patent Application No. PCT/CN2019/095761 having International filing date of Jul. 12, 2019, which claims the benefit of Chinese priority Patent Application No. 201910097591.1 filed on Jan. 31, 2019. The contents of the above applications are all incorporated by reference as if fully set forth herein in their entirety.

FIELD AND BACKGROUND OF THE INVENTION

The present invention relates to the field of display technologies, and in particular to an organic light emitting diode (OLED) display panel and a display device.

With development of full screen technologies, the technology of placing electronic components, such as under-screen cameras, under display screens, is a trend.

A cathode structure of a current OLED display panel is a tiled display panel, and a material thereof is a magnesium-silver alloy or a magnesium-silver laminated structure. Since silver has a large reflectance to light, when an external light passes through the cathode structure, the loss is large.

Figure 1:
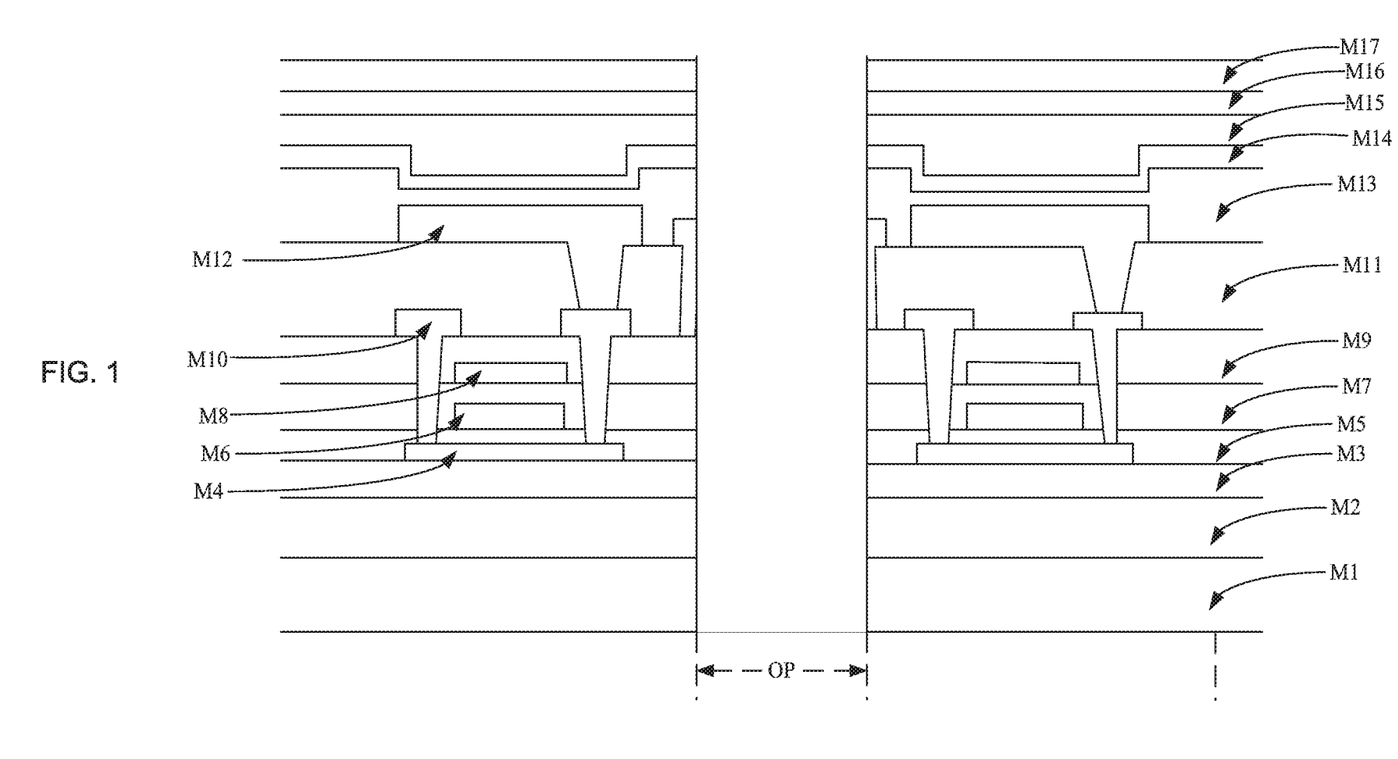
FIG. 1 is a schematic diagram of an organic light emitting diode (OLED) display panel in current full screen technologies.

Therefore, as shown in FIG. 1, in order to ensure the lighting effect of under-screen electronic components, such as a camera, materials above the camera (including TFT circuits, light emitting layers, cathode structures, etc.) needs to be removed, that is, a digging technology. However, the materials of a digging area (OP) corresponding to the technology do not have a hole, and it is difficult to package and cause external water and oxygen to easily enter.

Therefore, the current full screen technologies have technical problems that it is difficult to package the digging area, which causes external water and oxygen to easily enter, and needs to be improved.

SUMMARY OF THE INVENTION

The present invention provides an organic light emitting diode (OLED) display panel and a display device, which are used to solve technical problems that digging areas of current full screen technologies are difficulty to package and cause external water and oxygen to easily enter.

To solve the above problems, the technical solution provided by the present invention is as follows:

The present invention provides an OLED display panel, comprising:

an electronic component setting area corresponding to a position of an electronic component;

a light transmitting area at least partially disposed in the electronic component setting area;

a transparent filling layer disposed in the light transmitting area;

a built-in encapsulation layer disposed on the transparent filling layer; and a planarization layer disposed on the built-in encapsulation layer.

In the OLED display panel provided by an embodiment of the present invention, material of the built-in encapsulation layer is at least one of silicon oxide, silicon oxynitride, and silicon nitride.

In the OLED display panel provided by an embodiment of the present invention, further comprising a substrate functional layer and a driving circuit functional layer disposed on the substrate functional layer, wherein a first through hole is disposed at a position where the substrate functional layer and the driving circuit functional layer corresponding to the light transmitting area, and the transparent filling layer is filled in the first through hole.

In the OLED display panel provided by an embodiment of the present invention, the built-in encapsulation layer contacts the driving circuit functional layer after the built-in encapsulation layer covers the transparent filling layer.

In the OLED display panel provided by an embodiment of the present invention, an upside of the electronic component setting area corresponding to the light transmitting area is not provided with luminous pixels.

In the OLED display panel provided by an embodiment of the present invention, the electronic component setting area further comprises an array of luminous pixels disposed on the light transmitting area, at least a portion of the luminous pixels are provided with a second through hole, and the second through hole is filled with a transparent filling layer.

In the OLED display panel provided by an embodiment of the present invention, further comprising a transparent conductive layer disposed at a position corresponding to the light transmitting area, wherein the transparent conductive layer is disposed on the planarization layer.

In the OLED display panel provided by an embodiment of the present invention, the planarization layer is provided with a via hole at an edge of the built-in encapsulation layer, and the transparent conductive layer is disposed in the via hole and between the via holes.

In the OLED display panel provided by an embodiment of the present invention, further comprising a light emitting functional layer and an encapsulation layer disposed on the planarization layer, wherein the light emitting functional layer is provided with a third through hole at a position corresponding to the light transmitting area, and the encapsulation layer fills the third through hole.

In the OLED display panel provided by an embodiment of the present invention, the encapsulation layer comprises a first inorganic encapsulation layer, a first organic encapsulation layer, and a second inorganic encapsulation layer disposed in a stack, the third via hole penetrates the first inorganic encapsulation layer, and the third via hole is filled with the first organic encapsulation layer.

The present invention provides a display device, comprising:

an OLED display panel, wherein the OLED display panel comprises:

an electronic component setting area corresponding to a position of an electronic component:

a light transmitting area at least partially disposed in the electronic component setting area;

a transparent filling layer disposed in the light transmitting area;

a built-in encapsulation layer disposed on the transparent filling layer; and a planarization layer disposed on the built-in encapsulation layer.

In the display device provided by an embodiment of the present invention, the material of the built-in encapsulation layer is at least one of silicon oxide, silicon oxynitride, and silicon nitride.

In the display device provided by an embodiment of the present invention, further comprising a substrate functional layer and a driving circuit functional layer disposed on the substrate functional layer, wherein a first through hole is disposed at a position where the substrate functional layer and the driving circuit functional layer corresponding to the light transmitting area, and the transparent filling layer is filled in the first through hole.

In the display device provided by an embodiment of the present invention, the built-in encapsulation layer contacts the driving circuit functional layer after the built-in encapsulation layer covers the transparent filling layer.

In the display device provided by an embodiment of the present invention, an upside of the electronic component setting area corresponding to the light transmitting area is not provided with luminous pixels.

In the display device provided by an embodiment of the present invention, the electronic component setting area further comprises an array of luminous pixels disposed on the light transmitting area, at least a portion of the luminous pixels are provided with a second through hole, and the second through hole is filled with a transparent filling layer.

In the display device provided by an embodiment of the present invention, further comprising: a transparent conductive layer disposed at a position corresponding to the light transmitting area, wherein the transparent conductive layer is disposed on the planarization layer.

In the display device provided by an embodiment of the present invention, the planarization layer is provided with a via hole at an edge of the built-in encapsulation layer, and the transparent conductive layer is disposed in the via hole and between the via holes.

In the display device provided by an embodiment of the present invention, further comprising a light emitting functional layer and an encapsulation layer disposed on the planarization layer, wherein the light emitting functional layer is provided with a third through hole at a position corresponding to the light transmitting area, and the third through hole is filled with the encapsulation layer.

In the display device provided by an embodiment of the present invention, the encapsulation layer comprises a first inorganic encapsulation layer, a first organic encapsulation layer, and a second inorganic encapsulation layer disposed in a stack, the third via hole penetrates the first inorganic encapsulation layer, and the third through hole is filled with the first organic encapsulation layer.

The beneficial effects of the invention: The present invention provides an OLED display panel and a display device. The OLED display panel comprises an electronic component setting area corresponding to a position of an electronic component and a light transmitting area at least partially disposed in the electronic component setting area, a transparent filling layer disposed in the light transmitting area, a built-in encapsulation layer disposed on the transparent filling layer, and a planarization layer disposed on the built-in encapsulation layer. The present invention provides a transparent filling layer in the light transmitting area to replace a part of the film layer (especially a film layer with a large light barrier) to improve light transmittance. While realizing the built-in design of electronic components such as cameras, it does not form a void as in the prior art, and there is no technical problem that is difficult to package. At the same time, the built-in encapsulation layer is added between the transparent filling layer and the planarization layer, which reduces the speed of water and oxygen invading the inside of the device through the transparent filling layer, thereby prolonging the service life of the device.

BRIEF DESCRIPTION OF THE SEVERAL VIEWS OF THE DRAWINGS

In order to further understand the features and technical details of the present invention, please refer to the following detailed description and drawings regarding the present invention. The drawings are provided for reference and description only and are not intended to limit the present invention.

DESCRIPTION OF SPECIFIC EMBODIMENTS OF THE INVENTION

The following embodiments refer to the accompanying figures for exemplifying specific implementable embodiments of the present disclosure in a suitable computing environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

The present invention is directed to technical problems that there are defects in current electronic component technologies, and embodiments of the present invention can solve the problems.

As shown in FIG. 1, in order to ensure the lighting effect of the under-screen electronic components, such as a camera, structures of the upper portion of the camera (i.e. the OP area in FIG. 1) (including transistor circuits, light-emitting layers, cathode structures, etc.) need to be removed. That is, a hole-punching technique. But the technology has two problems: Problem 1. There are no film modules in the digging area having a hole, which is difficult to package. Problem 2, the digging area is not displayed because there is no display substance, and thus not a full screen in the true sense. The following embodiments of the present invention can solve at least Problem 1. In some embodiments, Problem 1 can be solved while solving Problem 2.

In an embodiment, as shown in FIG. 2 to FIG. 9, the present invention provides an organic light emitting diode (OLED) display panel. The OLED display panel comprises an electronic component setting area A1 corresponding to a position of an electronic component 3, and a light transmitting area A2 at least partially disposed in the electronic component setting area. A transparent filling layer 21 is disposed in the light transmitting area. The OLED display panel further comprises:

a built-in encapsulation layer M19 disposed on the transparent filling layer 21; and a planarization layer M11 disposed on the built-in encapsulation layer M19.

In an embodiment, the light transmitting area A2 refers to an area in which the transparent filling layer 21 is disposed. The area is replaced by a transparent filling layer 21 instead of a structural layer of a display panel, thereby enhancing a light transmittance of the display panel.

In an embodiment, the transparent filling layer 21 may be an organic glue filling area or the like. In this way, external light can pass through the light transmitting area and reach the electronic components disposed under the screen, such as cameras, light sensors, etc., so that the electronic components realize the corresponding functions.

In an embodiment, material of the built-in encapsulation layer M19 is at least one of silicon oxide, silicon oxynitride, and silicon nitride, which can form one or more layers to enhance the packaging effect.

In an embodiment, the OLED display panel further comprising a substrate functional layer and a driving circuit functional layer disposed on the substrate functional layer, wherein a first through hole is disposed at a position where the substrate functional layer and the driving circuit functional layer corresponding to the light transmitting area, and the transparent filling layer 21 is filled in the first through hole.

In an embodiment, the built-in encapsulation layer M19 contacts the driving circuit functional layer, for example, an upper surface of driving circuit functional layer (e.g. the insulating layer M9) after the built-in encapsulation layer M19 covers the transparent filling layer 21.

In an embodiment, the OLED display panel further comprises a transparent conductive layer M18 disposed at a corresponding position of the light transmitting area, and the transparent conductive layer is disposed on the planarization layer.

In an embodiment, the planarization layer is provided with a via hole at an edge of the built-in encapsulation layer, and the transparent conductive layer is disposed in the via hole and between the via holes.

In an embodiment, the OLED display panel further comprises a light emitting functional layer and an encapsulation layer disposed on the planarization layer, wherein the light emitting functional layer is provided with a third through hole at a position corresponding to the light transmitting area, and the third through hole is filled with the encapsulation layer.

In an embodiment, the encapsulation layer comprises a first inorganic encapsulation layer, a first organic encapsulation layer, and a second inorganic encapsulation layer disposed in a stack, the third via hole penetrates the first inorganic encapsulation layer, and the third via hole is filled with the first organic encapsulation layer.

The present invention provides an OLED display panel and a display device. The OLED display panel comprises an electronic component setting area corresponding to a position of an electronic component and a light transmitting area at least partially disposed in the electronic component setting area, a transparent filling layer disposed in the light transmitting area, a built-in encapsulation layer disposed on the transparent filling layer, and a planarization layer disposed on the built-in encapsulation layer. The present invention provides a transparent filling layer in the light transmitting area to replace a part of the film layer (especially a film layer with a large light barrier) to improve light transmittance. While realizing the built-in design of electronic components such as cameras, it does not form a void as in the prior art, and there is no technical problem that is difficult to package. At the same time, the built-in encapsulation layer is added between the transparent filling layer and the planarization layer, which reduces the speed of water and oxygen invading the inside of the device through the transparent filling layer, thereby prolonging the service life of the device.

The electronic component 3 may be an electronic component or a collection of a plurality of electronic components, such as a camera, a light sensor, an infrared-based fingerprint recognition device, and the like. The electronic component setting area corresponding to the electronic component may not be provided with luminous pixels. In this case, Problem 1 can be solved. The luminous pixels can also be set, and Problem 2 can be solved at the same time. The analysis will be conducted for these two branches below.

Figure 2:
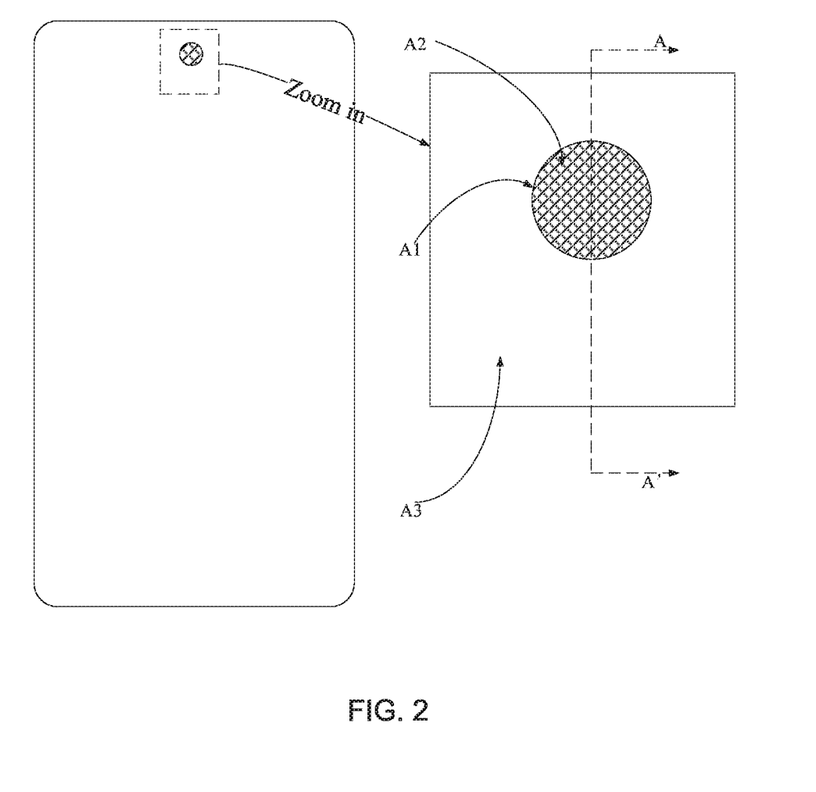
FIG. 2 is a first top view of an OLED display panel according to an embodiment of the present invention.

In an embodiment, as shown in FIG. 2, the OLED display panel provided in this embodiment does not have luminous pixels disposed on the electronic component setting area A1 corresponding to the light transmitting area A2. At this time, the light transmitting area A2 is the same as the electronic component setting area A1, that is, the electronic component setting area A1 adopts the setting mode of the light transmitting area A2.

In an embodiment, since the OLED display panel is not provided with the luminous pixels on the electronic component setting area A1 corresponding to the light transmitting area A2, the electronic component setting area A1 does not have a display function, and cannot display, thereby causing the device to emit light without affecting the lighting effect of the electronic component.

Figure 3:
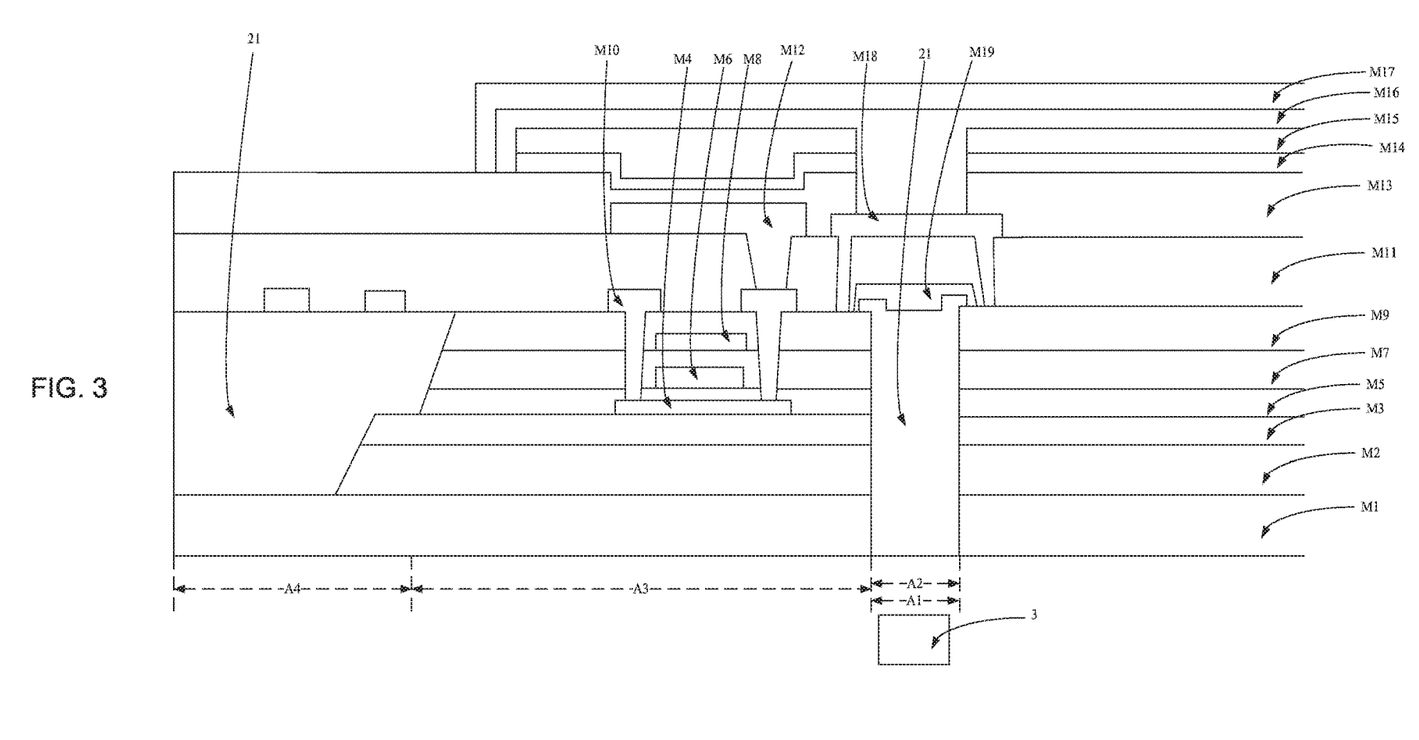
FIG. 3 is a first cross-sectional view of the OLED display panel according to the embodiment of the present invention along an A-A' line.

In an embodiment, as shown in FIG. 2 and FIG. 3, in the OLED display panel of the present invention, the OLED display panel further comprises an active area A3 (i.e. an effective light emitting area of the display panel) surrounding the light transmitting area. The OLED display panel comprises:

a layered substrate functional layer;

a driving circuit functional layer formed on the substrate functional layer;

a planarization layer M11 formed on the driving circuit functional layer;

a light emitting function layer formed on the flat layer M11; and an encapsulation layer formed on the light emitting function layer.

In an embodiment, a first through hole is disposed at a position where the substrate functional layer and the driving circuit functional layer corresponding to the light transmitting area A2. That is, the substrate functional layer and the driving circuit functional layer are in the active area A3, and the substrate functional layer and the driving circuit functional layer are not in the light transmitting area A2. At this time, a thickness of the transparent filling layer 21 disposed in the light transmitting area is not less than a total thickness of the substrate functional layer and the driving circuit functional layer disposed in the active area.

In an embodiment, the light emitting functional layer is provided with a third through hole at a position corresponding to the light transmitting area A2, and the encapsulation layer fills the third through hole. That is, the light emitting function layer is in the active area A3, and the light emitting function layer is not in the light transmitting area A2. A thickness of the encapsulation layer in the light transmitting area A2 is larger than a thickness of the encapsulation layer in the active area A3.

In an embodiment, the encapsulation layer comprises a first inorganic encapsulation layer, a first organic encapsulation layer, and a second inorganic encapsulation layer disposed in a stack. The third via hole penetrates the first inorganic encapsulation layer, and the first organic encapsulation layer fills the third via hole. That is, the light emitting functional layer and the first inorganic encapsulating layer are in the active area A3, and the light emitting functional layer and the first inorganic encapsulating layer are not in the light transmitting area A2. A thickness of the first organic encapsulation layer disposed in the light transmitting area A2 is greater than a thickness of the first organic encapsulation layer disposed in the active area A3.

In an embodiment, as shown in FIG. 3, in the active area A3, the OLED display panel comprises a flexible substrate M1, a buffer barrier layer M2, an inorganic buffer barrier layer M3, a low temperature polysilicon M4, a first gate insulating layer M5, a first gate M6, a second gate insulating layer M7, a second gate M8, an insulating layer M9, a drain/drain M10, a planarization layer M11, a first electrode M12, a pixel isolation layer M13, a light emitting layer and second electrode M14, a first inorganic encapsulation layer M15, a first organic encapsulation layer M16, and a second inorganic encapsulation layer M17, which are disposed sequentially from bottom to top.

At this time, the substrate functional layer comprises the flexible substrate M1, the buffer barrier layer M2 and inorganic buffer barrier layer M3. The drive circuit functional layer comprises the low temperature polysilicon M4, the first gate insulating layer M5, the first gate M6, the second gate insulating layer M7, the second gate M8, the insulating layer M9, and the drain/drain M10. The light emitting functional layer comprises the first electrode M12, the pixel isolation layer M13, and the light emitting layer and second electrode M14. The encapsulation layer in the active area A3 comprises the first inorganic encapsulation layer M15, the first organic encapsulation layer M16, and the second inorganic encapsulation layer M17. The first encapsulation layer in the light transmitting area A2 comprises the first organic encapsulation layer M16 and the second inorganic encapsulation layer M17.

In an embodiment, as shown in FIG. 3, in the OLED display panel of the present invention, the OLED display panel further comprises a panel bending area A4. In the panel bending area A4, the OLED display panel comprises the flexible substrate M1, the transparent filling layer 21, the drain/drain M10, the planarization layer M11, and the pixel isolation layer M13.

In an embodiment, as shown in FIG. 3, in the OLED display panel of the present invention, in the light transmitting area, the OLED display panel further comprises the transparent conductive layer M18. The transparent conductive layer is formed on the planarization layer, and the first organic encapsulation layer M16 is formed on the transparent conductive layer.

In an embodiment, the transparent conductive layer is patterned to form scan lines and data lines. The scan lines are used to connect gates of the same row of pixel driving transistors on both sides of the light transmitting area, and the data lines are used to connect sources/drains of the same column of pixel driving transistors on both sides of the light transmitting area.

In an embodiment, in the OLED display panel of the present invention, the OLED display panel does not comprise a transparent conductive layer in the light transmitting area. The first organic encapsulation layer M16 is formed on the planarization layer M11.

In an embodiment, as shown in FIG. 3, in the OLED display panel of the present invention, in the light transmitting area, the OLED display panel further comprises a built-in encapsulation layer M19 in the transparent filling layer, and the planarization layer is formed on the built-in encapsulation layer.

In an embodiment, in the OLED display panel of the present invention, in the light transmitting area, the OLED display panel does not comprise the built-in encapsulation layer M19, and the planarization layer is formed on the transparent filling layer.

Taking an electronic component as a camera as an example, the OLED display panel is a flexible substrate formed of a polyimide-based material (i.e. the M1 in the above), a buffer barrier layer formed of SiOx material (i.e. the M2 in the above), an inorganic buffer layer formed of a material such as SiN/SiOx (i.e. the M3 a in the above), a low-temperature polysilicon layer composed of low-temperature polysilicon (i.e. the M4 in the above), a first gate insulating layer composed of a SiN/SiOx material (i.e. the M5 in the above), a first gate composed of a material such as molybdenum (Mo) (i.e. the M6 in the above), a second gate insulating layer composed of SiN/SiOx (i.e. the M7 in the above), a second gate composed of a material such as Mo (i.e. the M8 in the above), an insulating layer such as SiN/SiOx (i.e. the M9 in the above), a source/drain composed of titanium aluminum titanium (Ti/Al/Ti) (i.e. the M10 in the above), openings filled with an organic filler layer (i.e. the 21 in the above), a built-in encapsulation layer such as SiN/SiOx/SiON (i.e. the M19 in the above), a flat layer formed of a polyimide-based material (i.e. the M11 in the above), a first electrode composed of ITO (conductive glass)/Ag (silver)/ITO (i.e. the M12 in the above), a pixel isolation layer formed of a polyimide-based material (i.e. the M13 in the above), a small molecule or a polymer, and a light-emitting layer composed of a metal such as Mg (magnesium)/Ag (i.e. the M14 in the above), a first inorganic encapsulating layer made of a material such as SiNx, SiOx, SiONx, Al2O3(alumina), or TiOx (titanium oxide) (i.e. the M15 in the above), a first organic encapsulating layer composed of acrylic, epoxy or silicone (ie, M16 above), and a second inorganic encapsulating layer made of a material such as SiNx, SiOx, SiONx, Al2O3, TiOx (i.e. the M16 in the above) from bottom to top.

The display panel device is divided into three parts: an active area A3, a panel bending (PB) area, and a camera under panel (CUP) area (i.e. the electronic component setting area A1). Wherein:

Above the CUP area, the flexible substrate, the buffer barrier layer, the inorganic buffer layer, the low temperature polysilicon layer, the first gate insulating layer, the first gate, the second gate insulating layer, the second gate, and the insulating layer are all removed, and then filled with transparent organic glue to form a transparent filling layer. In order to block an invasion of water and oxygen from the flexible substrate, a built-in encapsulation layer of SiNx or SiOx or SiONx is added. The top of the built-in encapsulation layer is a planarization layer, and the planarization layer corresponds to the openings of both sides of the built-in encapsulation layer. Depositing an ITO layer (made in sync with the AND layer ITO/Ag/ITO, but removing Ag) as a transparent electrode (for patterning the scan lines and the data lines). Above the ITO is a first organic encapsulation layer and a second inorganic encapsulation layer.

Figure 4:
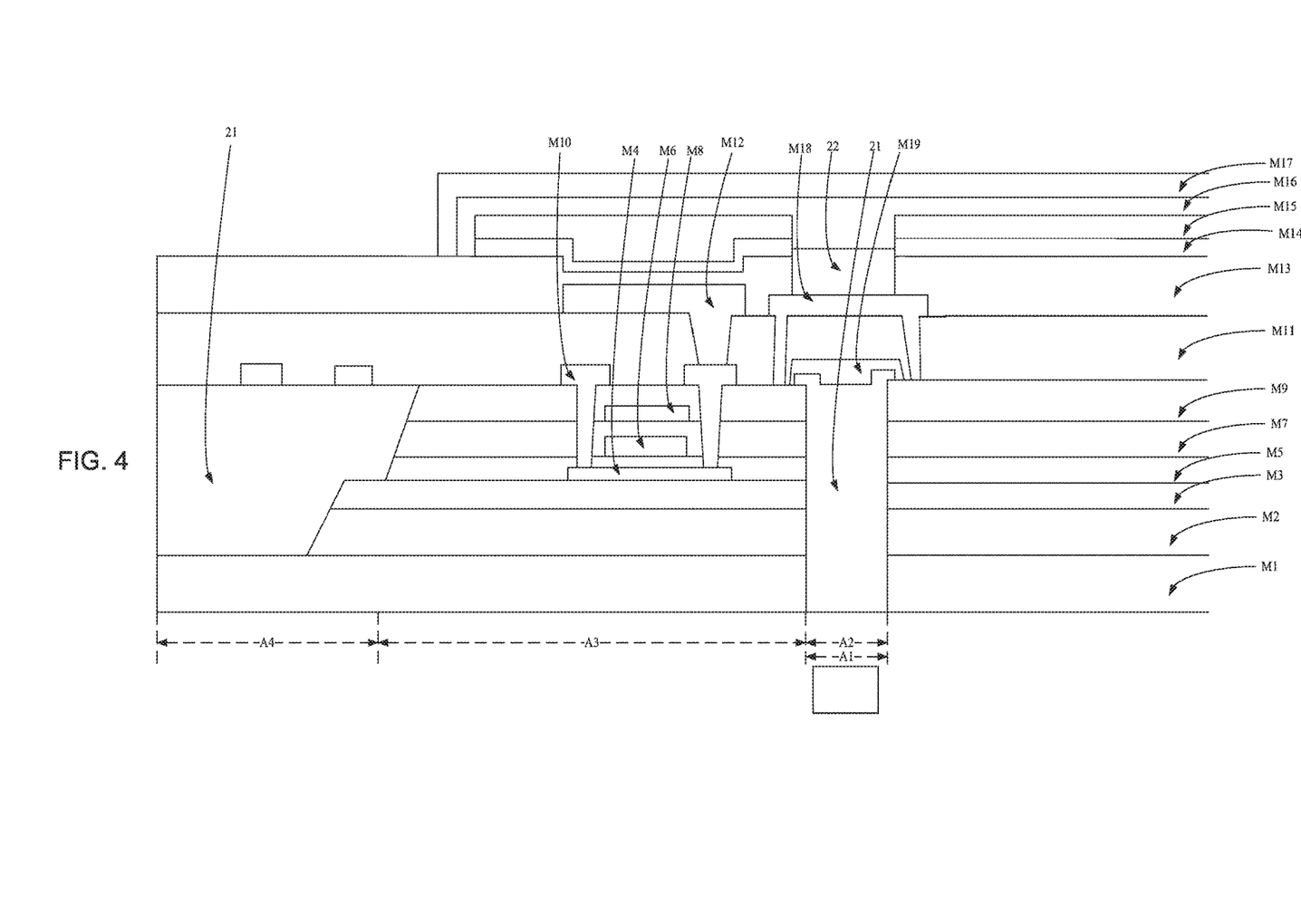
FIG. 4 is a second cross-sectional view of the OLED display panel according to the embodiment of the present invention along the A-A' line.

In an embodiment, as shown in FIG. 4, in the OLED display panel of the present invention, in the light transmitting area, the OLED display panel further comprises a reinforced transparent filling layer 22 disposed between the planarization layer M11 and the encapsulation layer.

In an embodiment, the reinforced transparent fill layer 22 can be an organic glue fill layer or the like.

In an embodiment, as shown in FIG. 4, the reinforced transparent filling layer 22 is formed on the transparent conductive layer M18, and the encapsulation layer is formed on the reinforced transparent filling layer 22.

In an embodiment, the reinforced transparent filling layer 22 is formed on the planarization layer M11, and the encapsulation layer is formed on the reinforced transparent filling layer 22.

The embodiment shown in FIG. 4 can further enhance the light transmittance of the light transmitting area.

Figure 5:
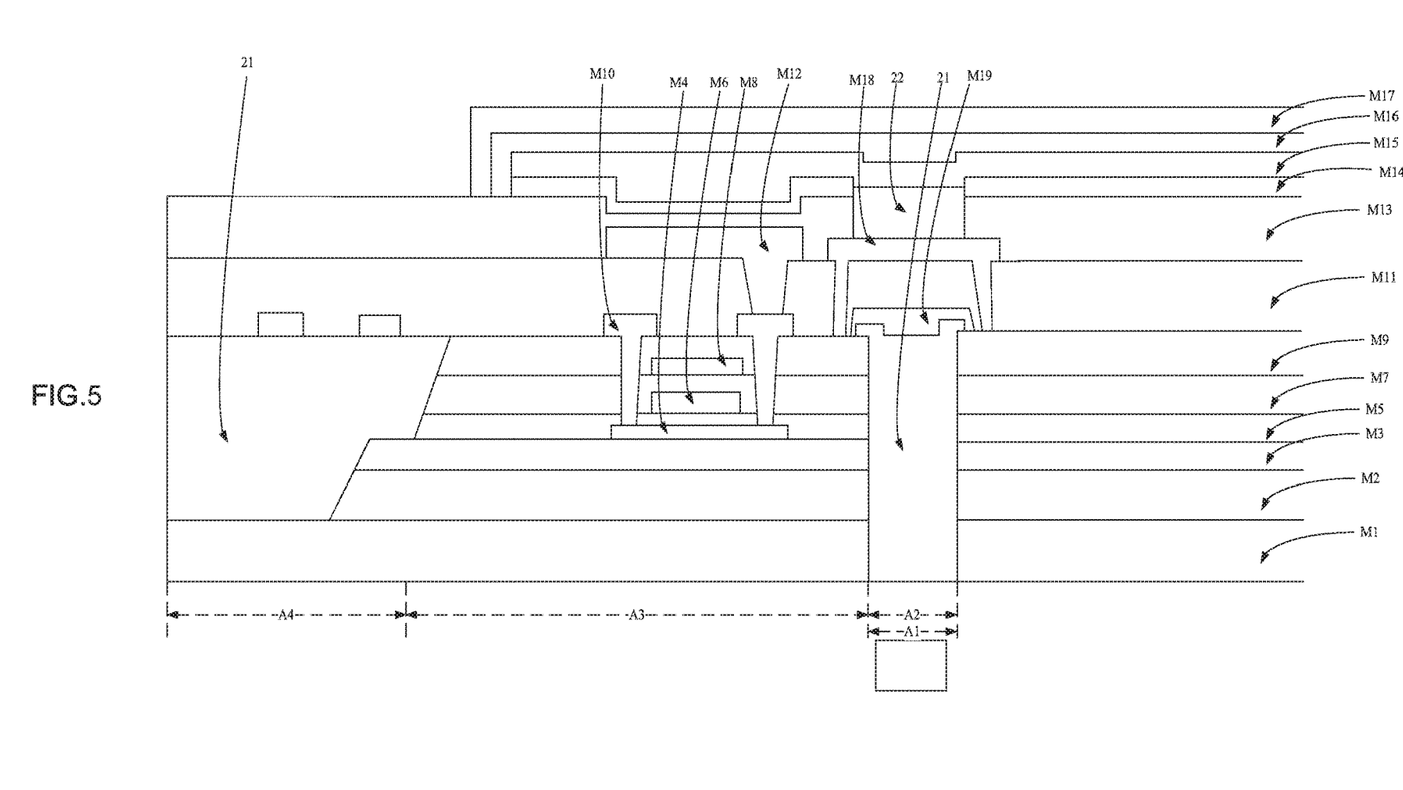
FIG. 5 is a third cross-sectional view of the OLED display panel according to the embodiment of the present invention along the A-A' line.

In an embodiment, as shown in FIG. 5, in the OLED display panel of the present invention, in the light transmitting area, the encapsulation layer comprises the first inorganic encapsulation layer M15, the second organic encapsulation layer M16, and the second inorganic encapsulation layer M17. The first inorganic encapsulation layer M15 is formed on the reinforcing transparent filling layer 22.

In an embodiment, in the OLED display panel of the present invention, in the light transmitting area, the encapsulation layer comprises the first inorganic encapsulation layer M15, the second organic encapsulation layer M16, and the second inorganic encapsulation layer M17. The first inorganic encapsulation layer M15 is formed on the transparent conductive layer.

In an embodiment, in the OLED display panel of the present invention, in the light transmitting area, the OLED display panel comprises a reinforced transparent filling layer 22, and the first encapsulation layer comprises a first inorganic encapsulation layer M15, a second organic encapsulation layer M16, and a second inorganic encapsulation layer M17. The reinforced transparent filling layer 22 is formed on the planarization layer M11, and the first inorganic encapsulating layer M15 is formed on the reinforced transparent filling layer 22.

In an embodiment, in the OLED display panel of the present invention, in the light transmitting area, the OLED display panel comprises a transparent conductive layer and a reinforced transparent fill layer 22. The encapsulation layer comprises a first inorganic encapsulation layer M15, a second organic encapsulation layer M16, and a second inorganic encapsulation layer M17. The transparent conductive layer is formed on the planarization layer M11. The reinforced transparent fill layer 22 is formed on the transparent conductive layer M11. The first inorganic encapsulation layer M15 is formed on the reinforced transparent fill layer 22.

Figure 6:
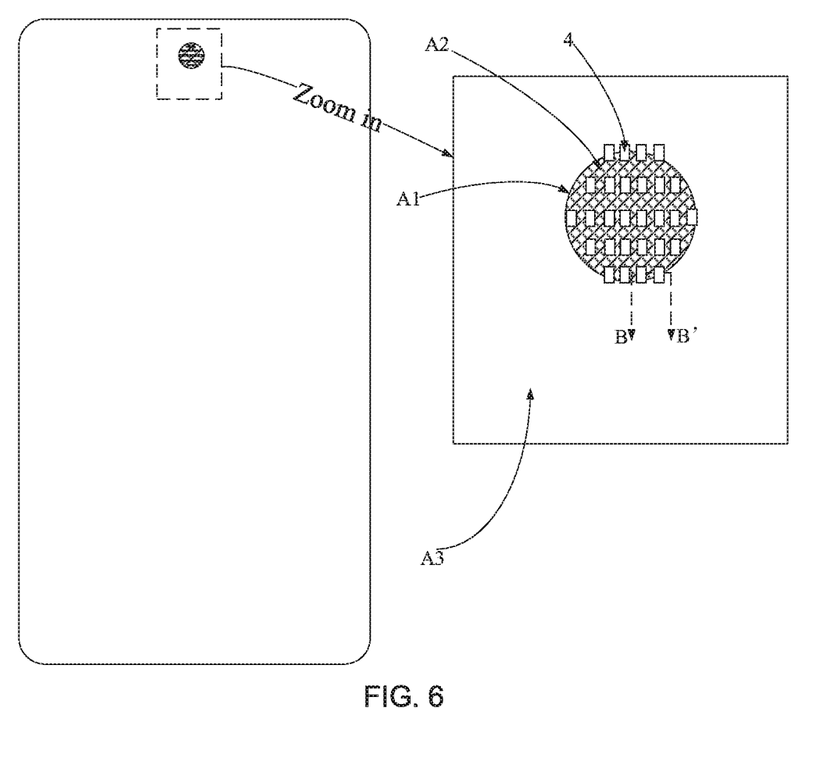
FIG. 6 is a second top view of the OLED display panel according to the embodiment of the present invention.
Figure 7:
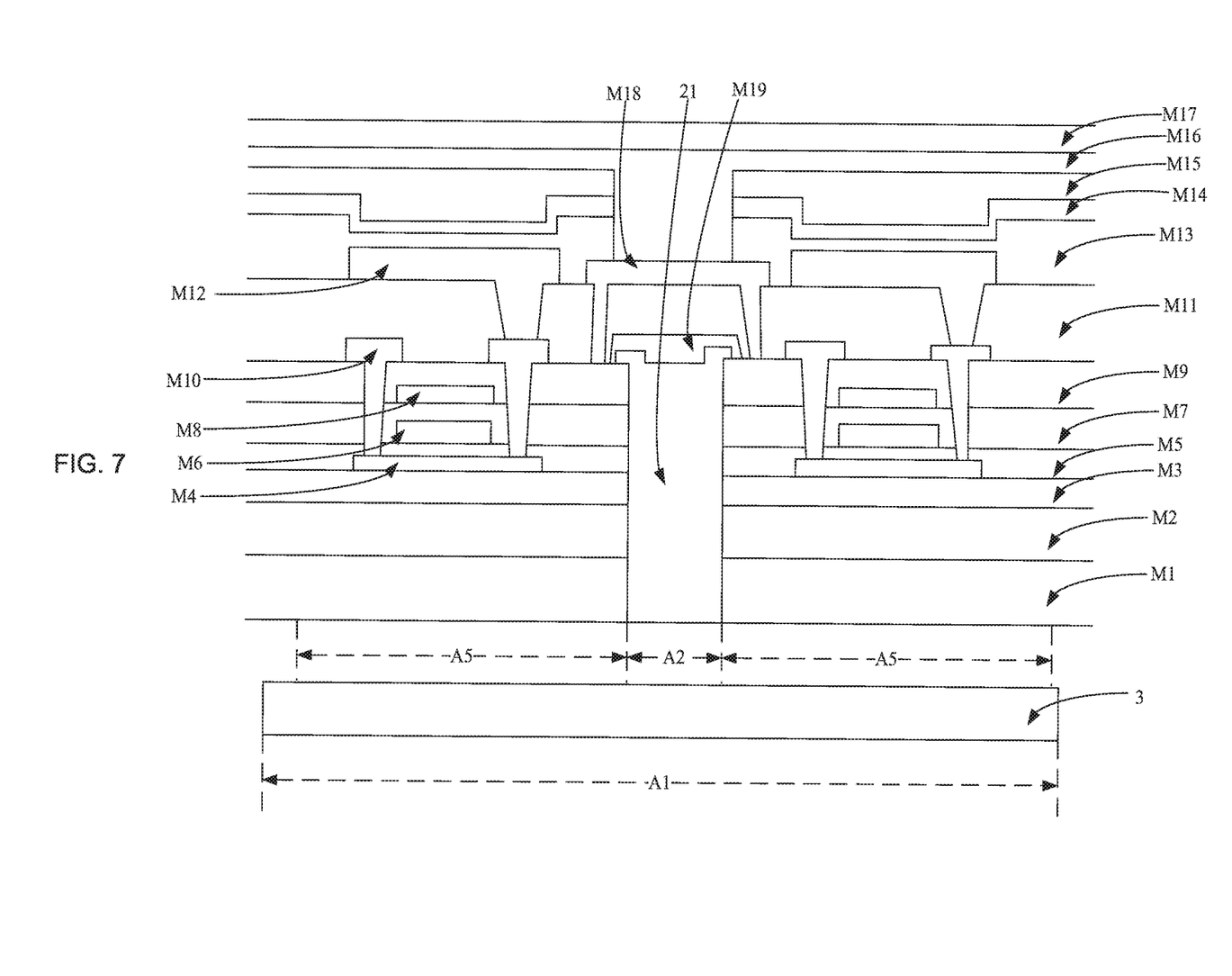
FIG. 7 is a first cross-sectional view of the OLED display panel according to an embodiment of the present invention along a B-B' line.

In an embodiment, as shown in FIG. 6 and FIG. 7, the OLED display panel provided in this embodiment further comprises a luminous pixel array disposed on the light transmitting area A2 in the electronic component setting area A1. A second through hole is formed between at least some of the luminous pixels, and the second through hole is filled with a transparent filling layer 21. At this time, the electronic component setting area A1 has a display function and can display pictures. The luminous pixel array comprises the arranged sub-pixels 4 shown in FIG. 6. At this time, in order not to affect the normal light emission of the luminous pixel array in the electronic component setting area A1, the light transmitting area A2 is filled between adjacent pixels of the luminous pixel array. For the convenience of the following description, the area corresponding to the sub-pixels 4 is referred to as the light emitting area A5.

In an embodiment, a pixel density of the luminous pixel array in the electronic component setting area A1 is smaller than a pixel density of the luminous pixel array in the active area A3, so that the light transmission effect of the electronic component setting area A1 can be further enhanced.

In an embodiment, as shown in FIG. 7, in the OLED display panel of the present invention, the OLED display panel comprises:
a layered substrate functional layer;
a driving circuit functional layer formed on the substrate functional layer;
a planarization layer M11 formed on the driving circuit functional layer;
a light emitting function layer formed on the planarization layer M11;
an encapsulation layer formed on the light emitting function layer.

In an embodiment, a first through hole is disposed at a position where the substrate functional layer and the driving circuit functional layer corresponding to the light transmitting area A2. That is, the substrate functional layer and the driving circuit functional layer are in the light emitting area A5, and the substrate functional layer and the driving circuit functional layer are not in the light transmitting area A2. At this time, a thickness of the transparent filling layer 21 disposed in the light transmitting area is not less than a total thickness of the substrate functional layer and the driving circuit functional layer disposed in a standard active area.

In an embodiment, the light emitting functional layer is provided with a third through hole at a position corresponding to the light transmitting area A2, and the encapsulation layer fills the third through hole. That is, the light emitting function layer is in the light emitting area A5, and the light emitting function layer is not in the light transmitting area A2. A thickness of the encapsulation layer in the light transmitting area A2 is larger than a thickness of the encapsulation layer in the light emitting area A5.

In an embodiment, in order to further increase the light transmissive effect of the light transmitting area A2, in the OLED display panel of the present invention, the electrode layer of the luminous pixel in the electronic component setting area is a transparent conductive layer.

In an embodiment, as shown in FIG. 7, in the light emitting area A5, the OLED display panel comprises:
a flexible substrate M1, a buffer barrier layer M2, an inorganic buffer barrier layer M3, a low temperature polysilicon M4, a first gate insulating layer M5, a first gate M6, a second gate insulating layer M7, a second gate M8, an insulating layer M9, a drain/drain M10, a planarization layer M11, a first electrode M12, a pixel isolation layer M13, a light emitting layer and second electrode M14, a first inorganic encapsulation layer M15, a first organic encapsulation layer M16, and a second inorganic encapsulation layer M17, which are disposed sequentially from bottom to top.

At this time, the substrate functional layer comprises the flexible substrate M1, the buffer barrier layer M2 and inorganic buffer layer M3. The drive circuit functional layer comprises the low temperature polysilicon M4, the first gate insulating layer M5, the first gate M6, the second gate insulating layer M7, the second gate M8, the insulating layer M9, and the drain/drain M10. The light emitting functional layer comprises the first electrode M12, the pixel isolation layer M13, and the light emitting layer and second electrode M14. The encapsulation layer in the active area A3 comprises the first inorganic encapsulation layer M15, the first organic encapsulation layer M16, and the second inorganic encapsulation layer M17. The first encapsulation layer in the light transmitting area A2 comprises the first organic encapsulation layer M16 and the second inorganic encapsulation layer M17.

In an embodiment, as shown in FIG. 7, in the OLED display panel of the present invention, in the light transmitting area, the OLED display panel further comprises a transparent conductive layer M18. The transparent conductive layer is formed on the planarization layer, and the encapsulation layer is formed on the transparent conductive layer.

In an embodiment, the transparent conductive layer is patterned to form scan lines and data lines. The transparent conductive layers disposed between the same row of sub-pixels are patterned to form the scan lines, and the scan lines are used to connect gates of the same row of pixel driving transistors on both sides of the light transmitting area. The transparent conductive layers disposed between the same column of the sub-pixels are patterned to form the data lines, and the data lines are used to connect the source/drain of the same column of pixel driving transistors on both sides of the light transmitting area.

In an embodiment, in the OLED display panel of the present invention, the OLED display panel does not comprise a transparent conductive layer in the light transmitting area. The encapsulation layer is formed on the planarization layer.

In an embodiment, as shown in FIG. 7, in the OLED display panel of the present invention, the OLED display panel further comprises a built-in encapsulation layer M19 in the transparent filling layer, and the planarization layer is formed on the built-in encapsulation layer.

In an embodiment, in the OLED display panel of the present invention, in the light transmitting area, the OLED display panel does not comprise the built-in encapsulation layer M19, and the planarization layer is formed on the transparent filling layer.

Take electronic components as large-size cameras as an example, the OLED display panel is a flexible substrate formed of a polyimide-based material (i.e. the M1 in the above), a buffer barrier layer formed of SiOx material (i.e. the M2 in the above), an inorganic buffer layer formed of a material such as SiN/SiOx (i.e. the M3 a in the above), a low-temperature polysilicon layer composed of low-temperature polysilicon (i.e. the M4 in the above), a first gate insulating layer composed of a SiN/SiOx material (i.e. the M5 in the above), a first gate composed of a material such as molybdenum (Mo) (i.e. the M6 in the above), a second gate insulating layer composed of SiN/SiOx (i.e. the M7 in the above), a second gate composed of a material such as Mo (i.e. the M8 in the above), an insulating layer such as SiN/SiOx (i.e. the M9 in the above), a source/drain composed of titanium aluminum titanium (Ti/Al/Ti) (i.e. the M10 in the above), the openings filled with an organic filler layer (i.e. the 21 in the above), a built-in encapsulation layer such as SiN/SiOx/SiON (i.e. the M19 in the above), a flat layer formed of a polyimide-based material (i.e. the M11 in the above), a first electrode composed of ITO (conductive glass)/Ag (silver)/ITO (i.e. the M12 in the above), a pixel isolation layer formed of a polyimide-based material (i.e. the M13 in the above), a small molecule or a polymer, and a light-emitting layer composed of a metal such as Mg (magnesium)/Ag (i.e. the M14 in the above), a first inorganic encapsulating layer made of a material such as SiNx, SiOx, SiONx, Al2O3(alumina), or TiOx (titanium oxide) (i.e. the M15 in the above), a first organic encapsulating layer composed of acrylic, epoxy or silicone (ie, M16 above), and a second inorganic encapsulating layer made of a material such as SiNx, SiOx, SiONx, Al2O3, TiOx (i.e. the M16 in the above) from bottom to top.

The display panel device is divided into three parts: an active area A3, a panel bending (PB) area, and a camera under panel (CUP) area (i.e. the electronic component setting area A1). Wherein:

Above the CUP area, the flexible substrate, the buffer barrier layer, the inorganic buffer layer, the low temperature polysilicon layer, the first gate insulating layer, the first gate, the second gate insulating layer, the second gate, and the insulating layer are all removed, and then filled with transparent organic glue to form a transparent filling layer. In order to block the invasion of water and oxygen from the flexible substrate, a built-in encapsulation layer of SiNx or SiOx or SiONx is added. The top of the built-in encapsulation layer is a planarization layer, and the planarization layer corresponds to the openings of both sides of the built-in encapsulation layer. Depositing an ITO layer (made in sync with the AND layer ITO/Ag/ITO, but removing Ag) as a transparent electrode (for patterning scan lines and data lines). Above the ITO is a first organic encapsulation layer and a second inorganic encapsulation layer.

The embodiment shown in FIG. 7 is similar to the embodiment shown in FIG. 3, with the difference that: The embodiment shown in FIG. 3 is that all the substrate functional layer and the driving circuit functional layer in the CUP area are removed, and are filled with an organic transparent glue or the like. The embodiment shown in FIG. 7 is that an area (i.e. the light emitting area A5 in the above) corresponding to the pixels with display in the CUP area remains unchanged, and a buffer barrier layer, an inorganic buffer layer, a low temperature polysilicon layer, a first gate insulating layer, a first gate, a second gate insulating layer, a second gate, and an insulating layer disposed in the non-pixel area (i.e. the light-transmitting area A2 in the above) are all removed, and then filled with transparent organic glue to form a transparent filled layer. In order to block the invasion of water and oxygen from the flexible substrate, a built-in encapsulation layer of SiNx or SiOx or SiONx is added. The top of the built-in encapsulation layer is a planarization layer, and the planarization layer corresponds to the openings of both sides of the built-in encapsulation layer. Depositing an ITO layer (made in sync with the AND layer ITO/Ag/ITO, but removing Ag) as a transparent electrode (for the patterning scan lines and data lines). Above the ITO is a first organic encapsulation layer and a second inorganic encapsulation layer.

In an embodiment, in order to further increase the light transmittance of the electronic component setting area, in the OLED display panel of the present invention, the electrode layer of the luminous pixel in the electronic component setting area is a transparent conductive layer, such as ITO and the like.

Figure 8:
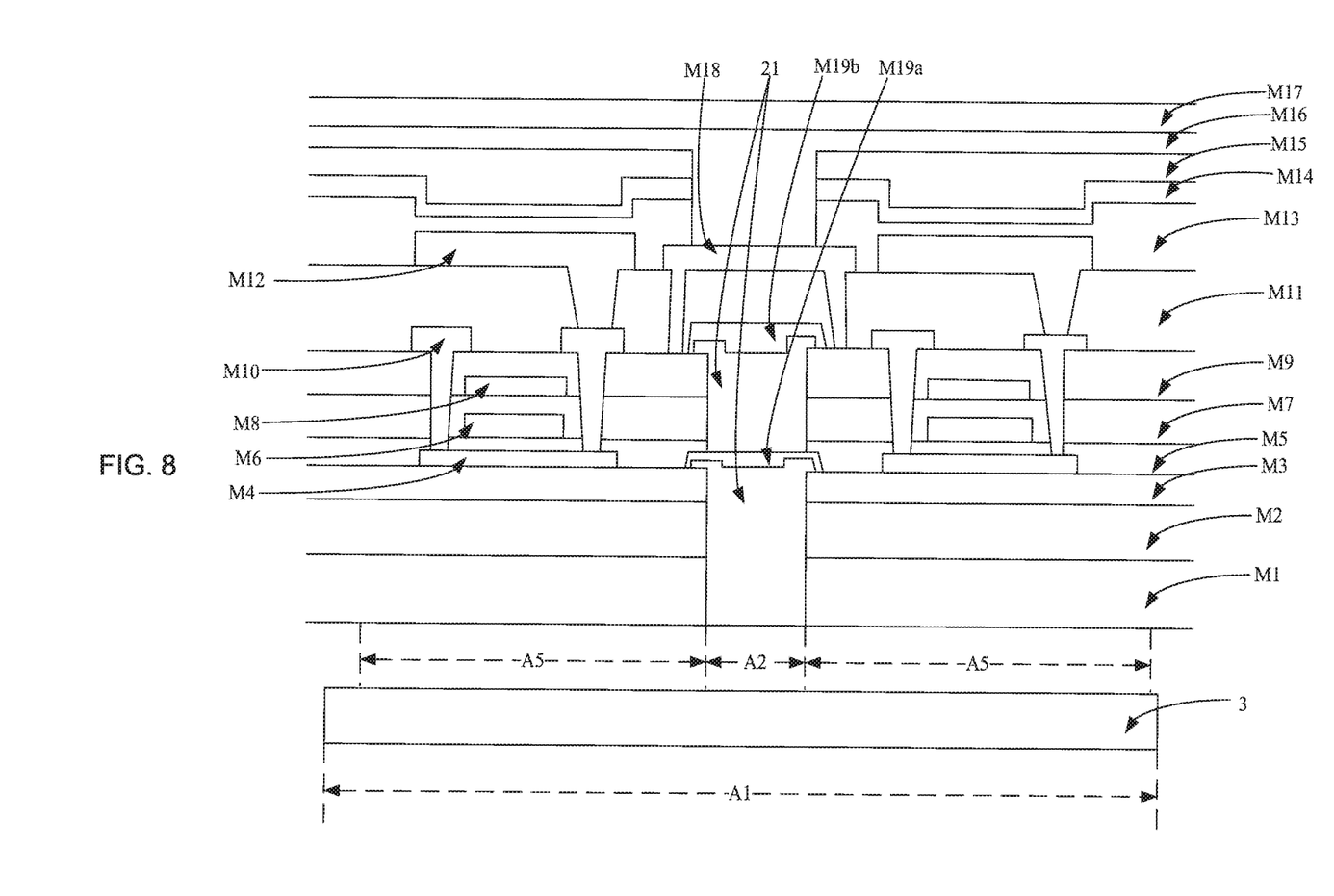
FIG. 8 is a second cross-sectional view of the OLED display panel according to the embodiment of the present invention along the B-B' line.

In an embodiment, as shown in FIG. 8, a plurality of built-in encapsulation layers may be disposed. For easy description, it is respectively referred to as a first built-in encapsulation layer M19a and a second built-in encapsulation layer M19b. The first built-in encapsulation layer M19a is disposed at a corresponding position of the interface between the substrate functional layer and the driving circuit functional layer in the light transmitting area, and serves as a first protection function. The second built-in encapsulation layer M19b is disposed at a corresponding position of the interface between the driving circuit functional layer and the planarization layer in the light transmitting area, and serves as a first protection function.

Figure 9:
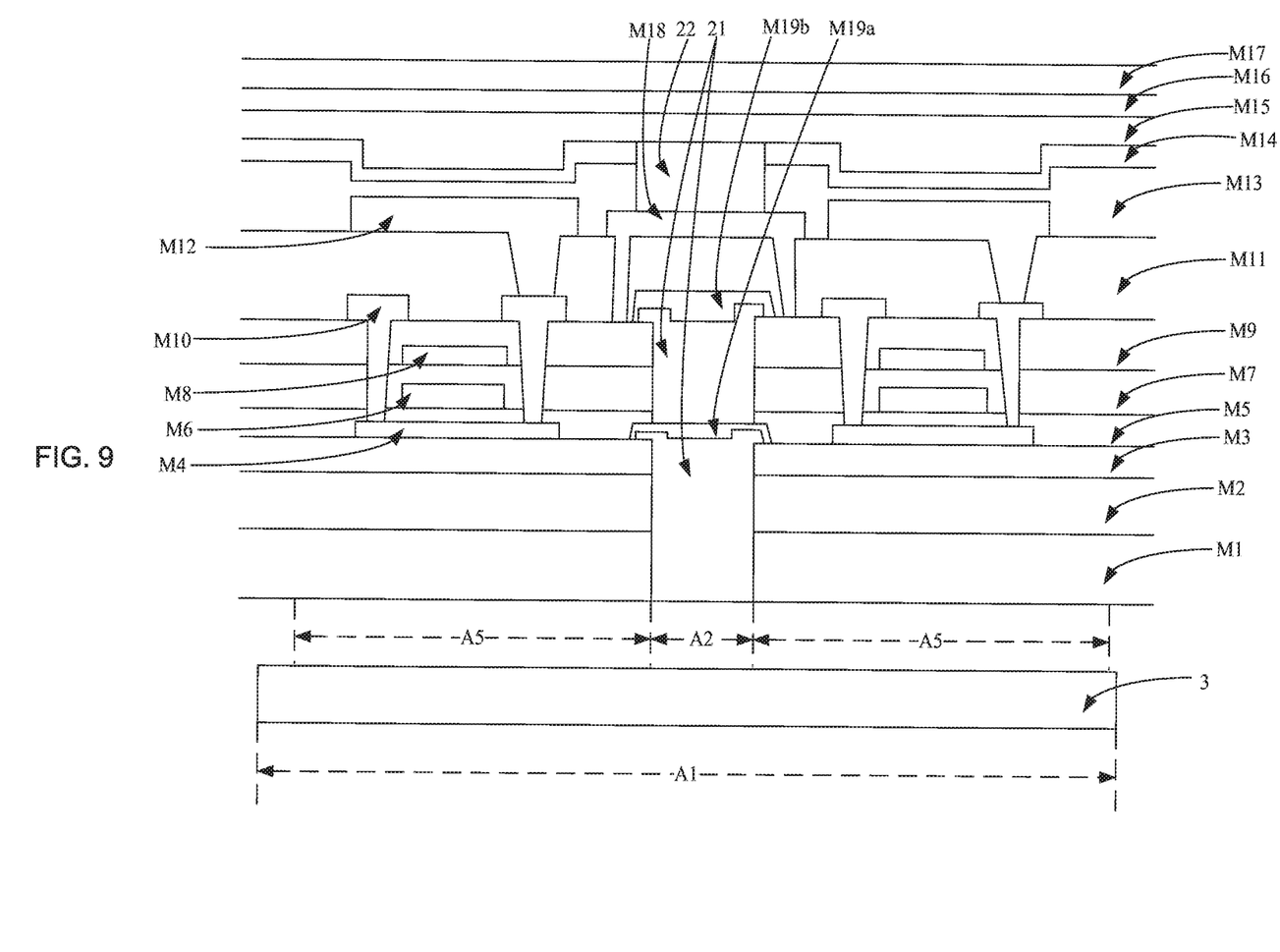
FIG. 9 is a third cross-sectional view of the OLED display panel according to the embodiment of the present invention along the B-B' line.

In an embodiment, as shown in FIG. 9, the encapsulation layer in the light transmitting area is identical to the encapsulation layer in other areas. At this time, the light emitting functional layer is provided with a third through hole corresponding to the position of the light transmitting area, the third through hole is filled with the reinforced transparent filling layer 22, and the encapsulation layer is formed on the reinforced transparent filling layer 22 and the light emitting functional layer.

Meanwhile, in an embodiment, the present invention further provides a display device, such as a flexible display device, etc., which comprises the OLED display panel provided by the present invention, and can implement a full screen. The OLED display panel comprises an electronic component setting area corresponding to a position of an electronic component, and a light transmitting area at least partially disposed in the electronic component setting area. A transparent filling layer is disposed in the light transmitting area. The OLED display panel further comprises a built-in encapsulation layer disposed on the transparent filling layer, and a planarization layer disposed on the built-in encapsulation layer.

In an embodiment, in the OLED display panel of the present invention, the material of the built-in encapsulation layer is at least one of silicon oxide, silicon oxynitride, and silicon nitride.

In an embodiment, in the OLED display panel of the present invention, the OLED display panel further comprises a substrate functional layer and a driving circuit functional layer disposed on the substrate functional layer, wherein a first through hole is disposed at a position where the substrate functional layer and the driving circuit functional layer corresponding to the light transmitting area, and the transparent filling layer is filled in the first through hole.

In an embodiment, in the OLED display panel of the present invention, the built-in encapsulation layer contacts the driving circuit functional layer after the built-in encapsulation layer covers the transparent filling layer.

In an embodiment, in the OLED display panel of the present invention, there are no luminous pixels disposed in the electronic component setting area, and the light transmitting area is the same as the electronic component setting area.

In an embodiment, in the OLED display panel of the present invention, a luminous pixel array is disposed in the electronic component setting area, and the light transmitting area is filled between adjacent pixels of the luminous pixel array.

In an embodiment, in the OLED display panel of the present invention, the OLED display panel further comprises a transparent conductive layer disposed at a position corresponding to the light transmitting area, wherein the transparent conductive layer is disposed on the planarization layer.

In an embodiment, in the OLED display panel of the present invention, the planarization layer is provided with a via hole at an edge of the built-in encapsulation layer, and the transparent conductive layer is disposed in the via hole and between the via holes.

In an embodiment, in the OLED display panel of the present invention, the OLED display panel further comprises a light emitting functional layer and an encapsulation layer disposed on the planarization layer, wherein the light emitting functional layer is provided with a third through hole at a position corresponding to the light transmitting area, and the encapsulation layer fills the third through hole.

According to the above embodiment:

The present invention provides an OLED display panel and a display device. The OLED display panel comprises an electronic component setting area corresponding to a position of an electronic component and a light transmitting area at least partially disposed in the electronic component setting area, a transparent filling layer disposed in the light transmitting area, a built-in encapsulation layer disposed on the transparent filling layer, and a planarization layer disposed on the built-in encapsulation layer. The present invention provides a transparent filling layer in the light transmitting area to replace a part of the film layer (especially a film layer with a large light barrier) to improve light transmittance. While realizing the built-in design of electronic components such as cameras, it does not form a void as in the prior art, and there is no technical problem that is difficult to package. At the same time, the built-in encapsulation layer is added between the transparent filling layer and the planarization layer, which reduces the speed of water and oxygen invading the inside of the device through the transparent filling layer, thereby prolonging the service life of the device.

In the above, various other corresponding changes and modifications can be made according to the technical solutions and technical ideas of the present invention to those skilled in the art, and all such changes and modifications are within the scope of the claims of the present invention.

What is claimed is:

1. An organic light emitting diode (OLED) display panel, comprising:
   an electronic component setting area corresponding to a position of an electronic component;
   a light transmitting area at least partially disposed in the electronic component setting area;
   a transparent filling layer disposed in the light transmitting area;
   a built-in encapsulation layer disposed on the transparent filling layer; and
   a planarization layer disposed on the built-in encapsulation layer.

2. The OLED display panel as claimed in claim 1, wherein material of the built-in encapsulation layer is at least one of silicon oxide, silicon oxynitride, and silicon nitride.

3. The OLED display panel as claimed in claim 1, further comprising a substrate functional layer and a driving circuit functional layer disposed on the substrate functional layer, wherein a first through hole is disposed at a position where the substrate functional layer and the driving circuit functional layer corresponding to the light transmitting area, and the transparent filling layer is filled in the first through hole.

4. The OLED display panel as claimed in claim 3, wherein the built-in encapsulation layer contacts the driving circuit functional layer after the built-in encapsulation layer covers the transparent filling layer.

5. The OLED display panel as claimed in claim 1, wherein an upside of the electronic component setting area corresponding to the light transmitting area is not provided with luminous pixels.

6. The OLED display panel as claimed in claim 1, wherein the electronic component setting area further comprises an array of luminous pixels disposed on the light transmitting area, at least a portion of the luminous pixels are provided with a second through hole, and the second through hole is filled with a transparent filling layer.

7. The OLED display panel as claimed in claim 1, further comprising a transparent conductive layer disposed at a position corresponding to the light transmitting area, wherein the transparent conductive layer is disposed on the planarization layer.

8. The OLED display panel as claimed in claim 7, wherein the planarization layer is provided with a via hole at an edge of the built-in encapsulation layer, and the transparent conductive layer is disposed in the via hole and between the via holes.

9. The OLED display panel as claimed in claim 1, further comprising a light emitting functional layer and an encapsulation layer disposed on the planarization layer, wherein the light emitting functional layer is provided with a third through hole at a position corresponding to the light transmitting area, and the third through hole is filled with the encapsulation layer.

10. The OLED display panel as claimed in claim 9, wherein the encapsulation layer comprises a first inorganic encapsulation layer, a first organic encapsulation layer, and a second inorganic encapsulation layer disposed in a stack, the third via hole penetrates the first inorganic encapsulation layer, and the third via hole is filled with the first organic encapsulation layer.

11. A display device, comprising:
an organic light emitting diode (OLED) display panel, wherein the OLED display panel comprises:
an electronic component setting area corresponding to a position of an electronic component:
a light transmitting area at least partially disposed in the electronic component setting area;
a transparent filling layer disposed in the light transmitting area;
a built-in encapsulation layer disposed on the transparent filling layer; and
a planarization layer disposed on the built-in encapsulation layer.

12. The display device as claimed in claim 11, wherein the material of the built-in encapsulation layer is at least one of silicon oxide, silicon oxynitride, and silicon nitride.

13. The display device as claimed in claim 11, further comprising a substrate functional layer and a driving circuit functional layer disposed on the substrate functional layer, wherein a first through hole is disposed at a position where the substrate functional layer and the driving circuit functional layer corresponding to the light transmitting area, and the transparent filling layer is filled in the first through hole.

14. The display device as claimed in claim 13, wherein the built-in encapsulation layer contacts the driving circuit functional layer after the built-in encapsulation layer covers the transparent filling layer.

15. The display device as claimed in claim 11, wherein an upside of the electronic component setting area corresponding to the light transmitting area is not provided with luminous pixels.

16. The display device as claimed in claim 11, wherein the electronic component setting area further comprises an array of luminous pixels disposed on the light transmitting area, at least a portion of the luminous pixels are provided with a second through hole, and the second through hole is filled with a transparent filling layer.

17. The display device as claimed in claim 11, further comprising: a transparent conductive layer disposed at a position corresponding to the light transmitting area, wherein the transparent conductive layer is disposed on the planarization layer.

18. The display device as claimed in claim 17, wherein the planarization layer is provided with a via hole at an edge of the built-in encapsulation layer, and the transparent conductive layer is disposed in the via hole and between the via holes.

19. The display device as claimed in claim 11, further comprising a light emitting functional layer and an encapsulation layer disposed on the planarization layer, wherein the light emitting functional layer is provided with a third through hole at a position corresponding to the light transmitting area, and the third through hole is filled with the encapsulation layer.

20. The display device as claimed in claim 19, wherein the encapsulation layer comprises a first inorganic encapsulation layer, a first organic encapsulation layer, and a second inorganic encapsulation layer disposed in a stack, the third via hole penetrates the first inorganic encapsulation layer, and the third through hole is filled with the first organic encapsulation layer.

* * * * *